(12) United States Patent
Choi (10) Patent No.: US 11,313,885 B2
(45) Date of Patent: Apr. 26, 2022

(54) INTEGRATED CURRENT-MEASURING APPARATUS

(71) Applicant: LG Chem, Ltd., Seoul (KR)

(72) Inventor: Jong-Tae Choi, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 16/966,923

(22) PCT Filed: Nov. 19, 2019

(86) PCT No.: PCT/KR2019/015896
§ 371 (c)(1),
(2) Date: Aug. 3, 2020

(87) PCT Pub. No.: WO2020/106044
PCT Pub. Date: May 28, 2020

(65) Prior Publication Data
US 2021/0048454 A1    Feb. 18, 2021

(30) Foreign Application Priority Data

Nov. 20, 2018  (KR) .................. 10-2018-0143785

(51) Int. Cl.
G01R 15/20  (2006.01)
G01R 31/3842  (2019.01)
G01R 1/20  (2006.01)

(52) U.S. Cl.
CPC .......... G01R 15/202 (2013.01); G01R 1/203 (2013.01); G01R 31/3842 (2019.01)

(58) Field of Classification Search
None
See application file for complete search history.

(56) References Cited

U.S. PATENT DOCUMENTS

| 2011/0068771 A1 | 3/2011 | Ueno et al. |
| 2012/0154104 A1 | 6/2012 | Hetzler |
| 2013/0057275 A1 | 3/2013 | Tamura et al. |

(Continued)

FOREIGN PATENT DOCUMENTS

| EP | 0867725 A1 | 9/1998 |
| JP | 2005127832 A | 5/2005 |

(Continued)

OTHER PUBLICATIONS

International Search Report for Application No. PCT/KR2019/015896 dated Feb. 25, 2020, 2 pages.

(Continued)

Primary Examiner — Jas A Sanghera
(74) Attorney, Agent, or Firm — Lerner, David, Littenberg, Krumholz & Mentlik, LLP (57) ABSTRACT

An integrated current-measuring apparatus including a printed circuit board, a shunt resistor including a resistive element having a preset resistance and terminals extending from both sides of the resistive element, the shunt resistor being attached to a bottom surface of the printed circuit board, and a Hall sensor mounted on a top surface of the printed circuit board to face the shunt resistor with the printed circuit board being interposed between the Hall sensor and the shunt resistor.

18 Claims, 7 Drawing Sheets (56) References Cited

U.S. PATENT DOCUMENTS

| | | | |
|---|---|---|---|
| 2014/0015636 A1* | 1/2014 | Tanaka | H01C 1/14 338/329 |
| 2014/0333314 A1 | 11/2014 | Kaupp | |
| 2015/0309080 A1 | 10/2015 | Chae et al. | |
| 2017/0003322 A1 | 1/2017 | Nakamura et al. | |
| 2017/0261536 A1 | 9/2017 | Chae et al. | |
| 2018/0113153 A1 | 4/2018 | Jang et al. | |
| 2020/0064380 A1* | 2/2020 | Li | G01R 19/32 |
| 2020/0088799 A1* | 3/2020 | Zeng | G01R 31/382 |

FOREIGN PATENT DOCUMENTS

| | | |
|---|---|---|
| JP | 2011064648 A | 3/2011 |
| JP | 2012531760 A | 12/2012 |
| JP | 2014085245 A | 5/2014 |
| JP | 2015145813 A | 8/2015 |
| JP | 2015210272 A | 11/2015 |
| KR | 20090000596 U | 1/2009 |
| KR | 101398219 B1 | 5/2014 |
| KR | 101407664 B1 | 6/2014 |
| KR | 20150124358 A | 11/2015 |
| KR | 101687384 B1 | 12/2016 |
| KR | 20180044725 A | 5/2018 |
| WO | 2017222333 A1 | 12/2017 |

OTHER PUBLICATIONS

Extended European Search Report including Written Opinion for Application No. 19887874.6 dated Apr. 15, 2021, 8 pages.

* cited by examiner

PRIOR ART

INTEGRATED CURRENT-MEASURING APPARATUS

CROSS-REFERENCE TO RELATED APPLICATIONS

The present application is a national phase entry under 35 U.S.C. § 371 of International Application No. PCT/KR2019/015896 filed Nov. 19, 2019, published in Korean, which claims priority from Korean Patent Application No. 10-2018-0143785 filed Nov. 20, 2018, all of which are incorporated herein by reference.

TECHNICAL FIELD

The present disclosure relates to a current-measuring apparatus, and more particularly, to an integrated current-measuring apparatus including a plurality of current sensors using different current-measuring principles.

BACKGROUND ART

A power supply system of a battery pack using secondary batteries generally includes a current sensor for measuring a current. The current sensor monitors the status of the battery pack and detects, for example, overcurrent flowing through the battery pack, by measuring a current flowing along a charge/discharge path of the battery pack. The current measured by the current sensor may be used as information for calculating the state of charge (SOC) or as a criterion for determining whether a charge/discharge process is being normally performed.

However, when the current sensor does not operate normally due to breakage or the like, the current flowing through the battery pack may not be accurately detected. As a result, even when an error such as overcurrent occurs, the overcurrent may not be appropriately blocked and thus a serious problem such as breakage or explosion of the battery pack may be caused.

In particular, a lithium secondary battery pack which currently attracts much attention as an energy storage system (ESS) of an electric vehicle uses a high charge/discharge current of about 100 A to about 300 A and, when a current sensor of the battery pack for the electric vehicle may not accurately measure the charge/discharge current, the risk thereof will increase.

Figure 1:
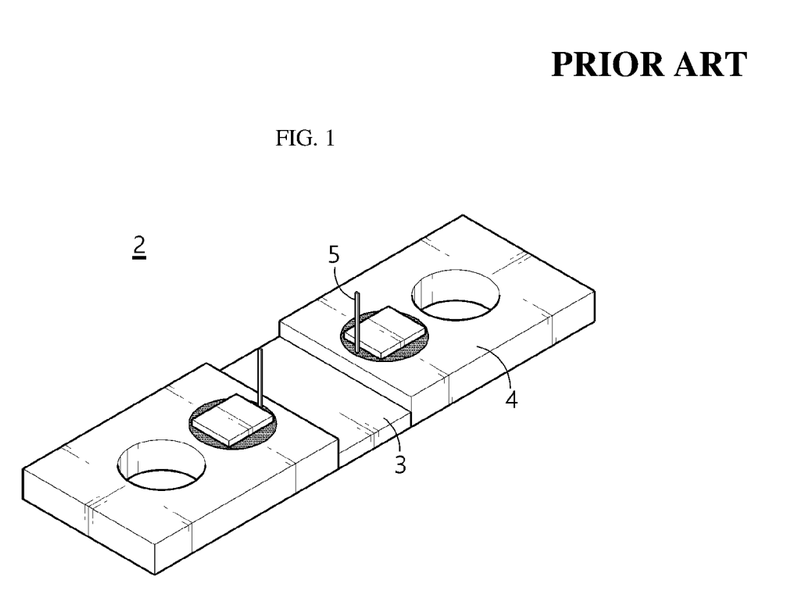
FIG. 1 is a view illustrating a shunt resistor according to a related art.

Among various types of current sensors, a shunt resistor illustrated in FIG. 1 is broadly used to measure a current of a battery pack. A conventional shunt resistor 2 illustrated in FIG. 1 includes a resistive element 3, and terminals 4 connected to both ends of the resistive element 3, and each terminal 4 includes a lead pin 5 configured to measure a voltage. The voltage is measured by soldering the lead pin 5 to a printed circuit board (PCB), and a current value is calculated by applying Ohm's law.

However, in the conventional shunt resistor 2, the lead pin 5 is vulnerable to vibration or impact generated when a vehicle runs, and thus is easily broken. In many cases, the broken lead pin 5 serves as a major cause of breakage of the current sensor.

The safety standards for electric vehicles (e.g., ISO 26262) are strengthened based on broad commercialization thereof, and a method of detecting and diagnosing malfunction of a current sensor is required to meet the standards.

Although a method of detecting and diagnosing malfunction including an error between two or more homogeneous or heterogeneous current sensors is disclosed as one of such methods, an integrated current-measuring apparatus capable of achieving both safety and economic feasibility may not be easily designed.

SUMMARY

Technical Problem

The present disclosure is designed to solve the problems of the related art, and therefore the present disclosure is directed to providing an integrated current-measuring apparatus capable of measuring a current of a battery pack by using a plurality of current sensors.

The present disclosure is also directed to providing an integrated current-measuring apparatus capable of stably operating under vibration and impact conditions to ensure functional safety of an electric vehicle.

Technical Solution

In one aspect of the present disclosure, there is provided an integrated current-measuring apparatus including a printed circuit board having opposing first and second surfaces, a shunt resistor including a resistive element having a preset resistance and terminals extending from both sides of the resistive element, the shunt resistor being attached to the first surface of the printed circuit board, and a Hall sensor mounted on the second surface of the printed circuit board to face the shunt resistor with the printed circuit board being interposed between the Hall sensor and the shunt resistor.

The shunt resistor may include first screw holes formed in the respective terminals of the shunt resistor with the resistive element being interposed between the first screw holes, and the integrated current-measuring apparatus may further include joint members integrally coupled to the first screw holes and to voltage-measuring nodes provided on the printed circuit board, to fix the shunt resistor to the first surface of the printed circuit board and electrically connect the terminals to the voltage-measuring nodes.

The printed circuit board may include a sensor mounting part protruding from a side of the printed circuit board in a first direction, and having a length in a second direction perpendicular to the first direction that is less than a length of the shunt resistor in the second direction, and the shunt resistor may be attached to the first surface of the printed circuit board at the sensor mounting part.

The sensor mounting part may include a first mounting portion and a second mounting portion spaced apart from each other by a predetermined gap.

The integrated current-measuring apparatus may further include a shield member forming a wall structure surrounding the Hall sensor and a part of the shunt resistor.

The shield member may include a pair of vertical panels spaced apart from each other in the first direction, and a horizontal panel configured to connect the pair of vertical panels, and the shunt resistor may be positioned between the sensor mounting part of the printed circuit board and the horizontal panel.

The gap between the first and second mounting portions may be "L" shaped and one of the pair of vertical panels may perpendicularly pass through the gap.

The integrated current-measuring apparatus may further include an assembly guide unit configured to maintain insulation between the shunt resistor and the shield member and to integrally mount the shunt resistor and the shield member on the sensor mounting part.

The assembly guide unit may include first and second supporting parts configured to surround the shunt resistor and the horizontal panel of the shield member from first and second sides, respectively, and the first and second supporting parts may be spaced apart from each other by a predetermined distance.

The assembly guide unit may further include an insulating plate located between the shunt resistor and the horizontal panel of the shield member and configured to connect the two supporting parts into a single body.

In another aspect of the present disclosure, there is provided a battery pack including an integrated current-measuring apparatus according to any of the embodiments herein.

Advantageous Effects

According to an aspect of the present disclosure, a current of a battery pack may be measured using two types of current sensors and thus malfunction including an error between the current sensors may be detected and diagnosed.

According to another aspect of the present disclosure, an integrated current-measuring apparatus capable of stably measuring a current of a battery pack under a vibration or impact condition and having a space-efficient assembly structure of current sensors may be provided.

DETAILED DESCRIPTION

Embodiments of the present disclosure are provided to fully convey the concept of the disclosure to one of ordinary skill in the art, and thus shapes and sizes of components may be exaggerated, omitted, or schematically illustrated in the drawings. Therefore, the size or rate of each component does not completely reflect a real size or rate thereof.

Hereinafter, the present disclosure will be described in detail by explaining embodiments of the disclosure with reference to the attached drawings. The terms or words used in the specification and the claims should not be limited to conventional or lexical meanings and should be construed as having meanings and concepts corresponding to the technical idea of the present disclosure in order to the most appropriately describe the present disclosure.

Figure 2:
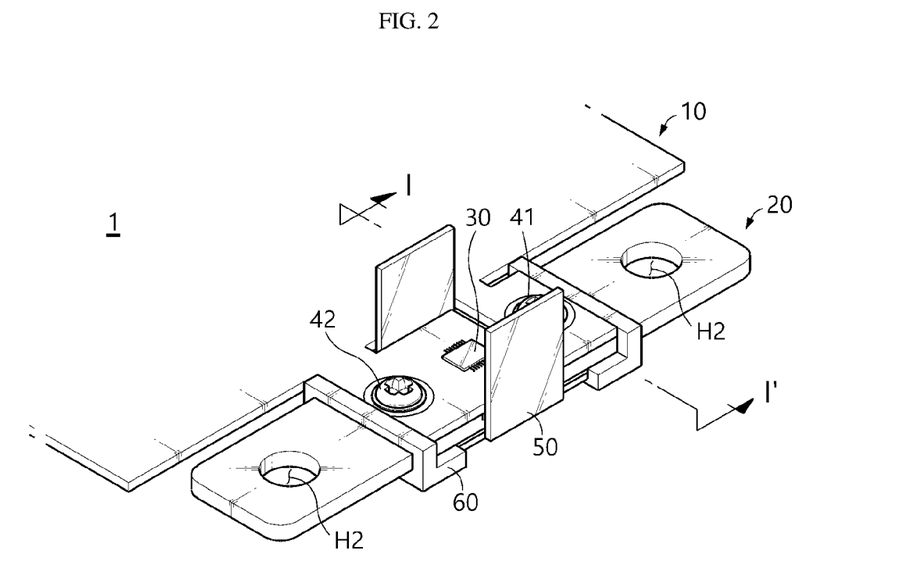
FIG. 2 is a perspective view illustrating the configuration of an integrated current-measuring apparatus according to an embodiment of the present disclosure.
Figure 3:
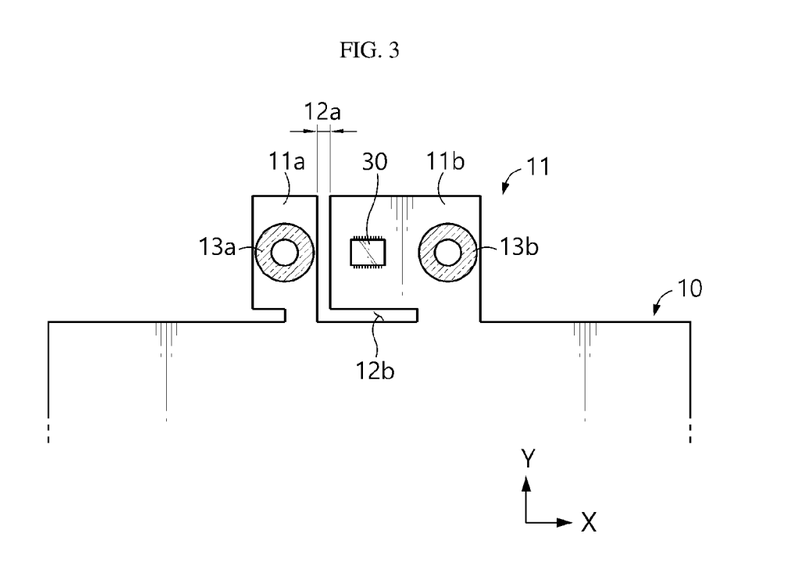
FIG. 3 is a plan view of a major part of a printed circuit board (PCB) according to an embodiment of the present disclosure.
Figure 4:
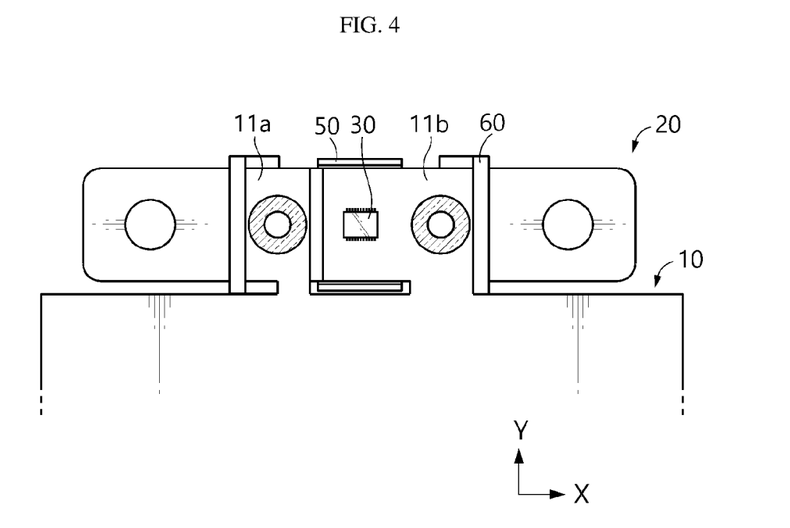
FIG. 4 is a view illustrating that a shunt resistor is mounted on the PCB of FIG. 3.

FIG. 2 is a perspective view illustrating the configuration of an integrated current-measuring apparatus 1 according to an embodiment of the present disclosure, FIG. 3 is a plan view of a major part of a printed circuit board (PCB) 10 according to an embodiment of the present disclosure, and FIG. 4 is a plan view illustrating a shunt resistor 20 mounted on the PCB 10 of FIG. 3.

Referring to FIGS. 2 to 4, the integrated current-measuring apparatus 1 according to an embodiment of the present disclosure includes the PCB 10, the shunt resistor 20 attached to a bottom surface of the PCB 10, and a Hall sensor 30 mounted on a top surface of the PCB 10.

As described in detail below, the integrated current-measuring apparatus 1 may be configured to connect the shunt resistor 20 and the Hall sensor 30 to the PCB 10 without using data or power cables as illustrated in FIG. 2. The reduction in the number of components may reduce manufacturing costs. In addition, the complementary and space-saving structure of the shunt resistor 20 and the Hall sensor 30 may minimize the apparatus volume.

The PCB 10 of the above-described integrated current-measuring apparatus 1 may be a PCB 10 of a battery management system (BMS) for managing charge/discharge of a battery pack.

Although not shown in FIGS. 2 to 4 for convenience of illustration, the PCB 10 may selectively include an analog-to-digital (ADC) circuit configured to convert a voltage difference between both ends of the shunt resistor 20 and an output of the Hall sensor 30 into current values, a processor, an application-specific integrated circuit (ASIC), another chipset, a logic circuit, an amplifier, a comparator, a register, a communication modem, a data processor, etc., which are well-known in the art.

Particularly, the PCB 10 according to the current embodiment has an almost rectangular plate shape, and includes a sensor mounting part 11 protruding from a side of the PCB 10 as illustrated in FIG. 3. The sensor mounting part 11 provides a place to which the shunt resistor 20 and the Hall sensor 30 are assembled, and has a horizontal length less than that of the shunt resistor 20 in a direction (e.g., the X-axis direction) perpendicular to the direction of protrusion.

In this case, top surfaces of both ends of the shunt resistor 20 are open without being covered by the PCB 10 and thus the both ends of the shunt resistor 20 may be easily connected to other components. For example, an electric vehicle commonly uses high-voltage transmission cables and metal bar-shaped bus bars (not shown) as electrical wires to supply power of a battery pack to a load. The shunt resistor 20 needs to be connected to the bus bars to measure a current flowing between the battery pack and the load. In this case, the bus bars may be bolted to the both ends of the shunt resistor 20. For reference, holes H2 provided in the both ends of the shunt resistor 20 may be used to bolt the bus bars.

The sensor mounting part 11 may include a first mounting portion 11a and a second mounting portion 11b spaced apart from each other by a predetermined gap.

The shunt resistor 20 may be mounted on bottom surfaces of the first and second mounting portions 11a and 11b, and the Hall sensor 30 may be mounted on a top surface of the second mounting portion 11b.

Gaps 12a and 12b of the sensor mounting part 11 include a first gap 12a provided along the Y-axis direction, and a second gap 12b provided along the X-axis direction in FIG. 3. The first and second gaps 12a and 12b may have an almost "L" shape in a plan view.

The shunt resistor 20 is made of metal and may repeatedly contract/expand in a wide operating temperature range. The PCB 10 may crack due to the contraction/expansion of the shunt resistor 20. According to the current embodiment, by providing the first gap 12a in the sensor mounting part 11 to which the shunt resistor 20 is attached, breakage thereof may be prevented.

The most appropriate location of the first gap 12a is between points to which two joint members 41 and 42 to be described below are screwed to attach terminals 23 and 25 of the shunt resistor 20 to the sensor mounting part 11.

The points may be respectively provided at the first and second mounting portions 11a and 11b. The points correspond to locations of voltage-measuring nodes 13a and 13b. The voltage-measuring nodes 13a and 13b are nodes connected to the terminals 23 and 25 of the shunt resistor 20 by using the joint members 41 and 42 to detect a voltage difference due to a resistive element 21 of the shunt resistor 20.

The second gap 12b may be used to prevent cracks of the PCB 10 like the first gap 12a, and also be used as a space to which a vertical panel 51 of a shield member 50 to be described below is assembled.

Figure 5:
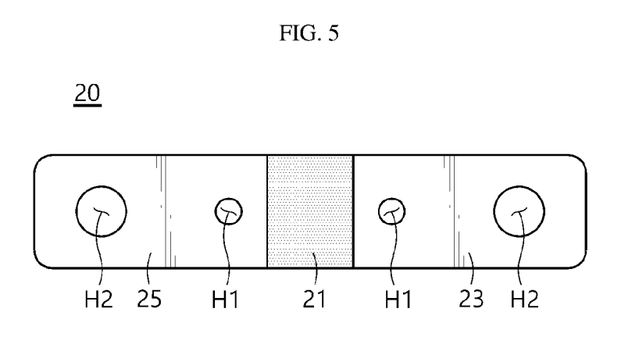
FIG. 5 is a plan view of the shunt resistor.

Referring to FIG. 5, the shunt resistor 20 of the current embodiment includes the resistive element 21 having a preset resistance and the terminals 23 and 25 extending from both sides of the resistive element 21. The resistive element 21 may be made of manganese (Mn), and the terminals 23 and 25 may be made of copper (Cu) or a Cu alloy. When a current flows through the shunt resistor 20, a voltage drop occurs in the resistive element 21 and a current value may be calculated according to Ohm's law by measuring a voltage difference in this case.

In general, the shunt resistor 20 measures voltages of the terminals 23 and 25 by using voltage-measuring lead pins soldered to the PCB 10. However, according to the present disclosure, the joint members 41 and 42 serve as the voltage-measuring lead pins. Screws or bolts may be employed as the joint members 41 and 42.

The joint members 41 and 42 mechanically fix the shunt resistor 20 to a bottom surface of the sensor mounting part 11 and electrically connect the terminals 23 and 25 to the voltage-measuring nodes 13a and 13b of the PCB 10.

To couple and electrically connect the shunt resistor 20 to the sensor mounting part 11 by using the joint members 41 and 42, through-holes may be provided in the centers of the voltage-measuring nodes 13a and 13b of the sensor mounting part 11 and first screw holes H1 having threads may be respectively provided in the terminals 23 and 25 of the shunt resistor 20.

Figure 6:
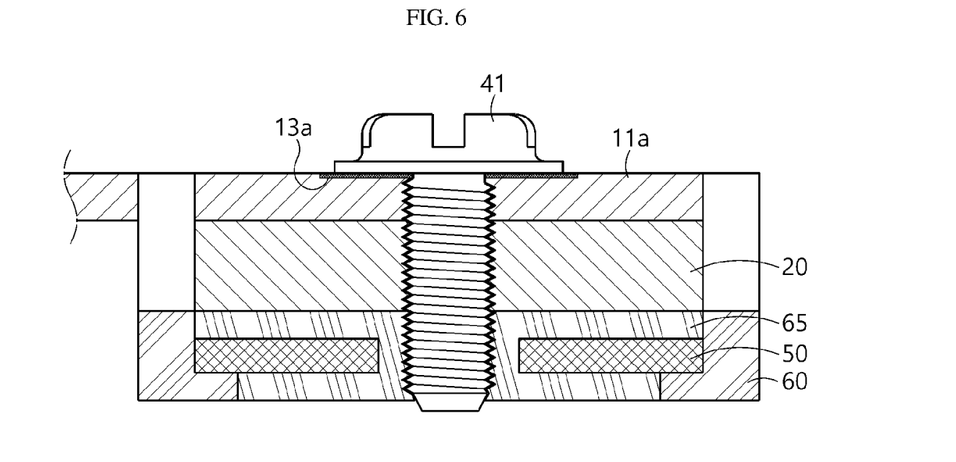
FIG. 6 is a cross-sectional view taken along I-I' of the integrated current-measuring apparatus of FIG. 2.

As illustrated in FIG. 6, the joint members 41 and 42 may be screwed into the through-holes and the first screw holes H1 such that the terminals 23 and 25 of the shunt resistor 20 may be electrically connected to the voltage-measuring nodes 13a and 13b. In this case, voltages detected by the voltage-measuring nodes 13a and 13b may be expressed as current values through the amplifier, the comparator, the ADC circuit, etc. on the PCB 10.

According to the current embodiment in which the joint members 41 and 42 screwable through the PCB 10 and the shunt resistor 20 are also used to detect voltages, electrical connection between the PCB 10 and the shunt resistor 20 may be stably maintained against vibration and impact and thus risk of breakage or malfunction may be reduced compared to conventional current sensors.

Meanwhile, the Hall sensor 30 refers to a sensor configured to measure a current by using the Hall effect indicating a physical phenomenon that a voltage difference occurs between both ends of an electrical wire (or conductor) when a magnetic field is applied perpendicular to the flow of a current in the electrical wire (or conductor).

In the current embodiment, the Hall sensor 30 may be mounted on the top surface of the PCB 10 to face the shunt resistor 20 with the PCB 10 being interposed between the Hall sensor 30 and the shunt resistor 20, and be used to measure a current flowing through the shunt resistor 20 located thereunder.

For instance, the Hall sensor 30 may output a voltage value to a circuit (not shown) on the PCB 10 connected to the Hall sensor 30, based on a magnetic flux change due to a current flowing through a middle part of the shunt resistor 20 located on the bottom surface of the sensor mounting part 11, and this value may be converted into a current value by the circuit.

For reference, the Hall sensor 30 of the current embodiment may generally employ a Hall sensor 30 using integrated magnetic concentrator (IMC) technology capable of accurately measuring a current without any bulky external ferromagnetic core. However, the scope of the present disclosure is not limited to the Hall sensor 30 using the IMC technology.

Figure 7:
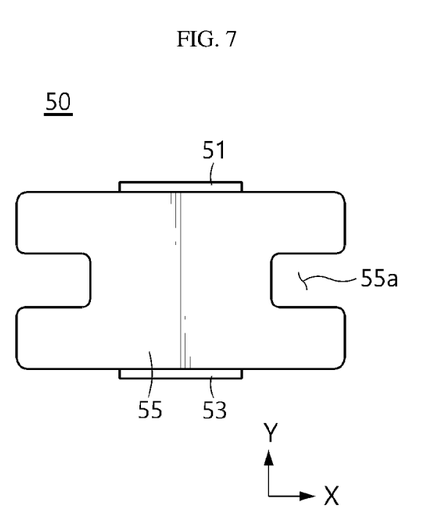
FIG. 7 is a plan view of a shield member.
Figure 8:
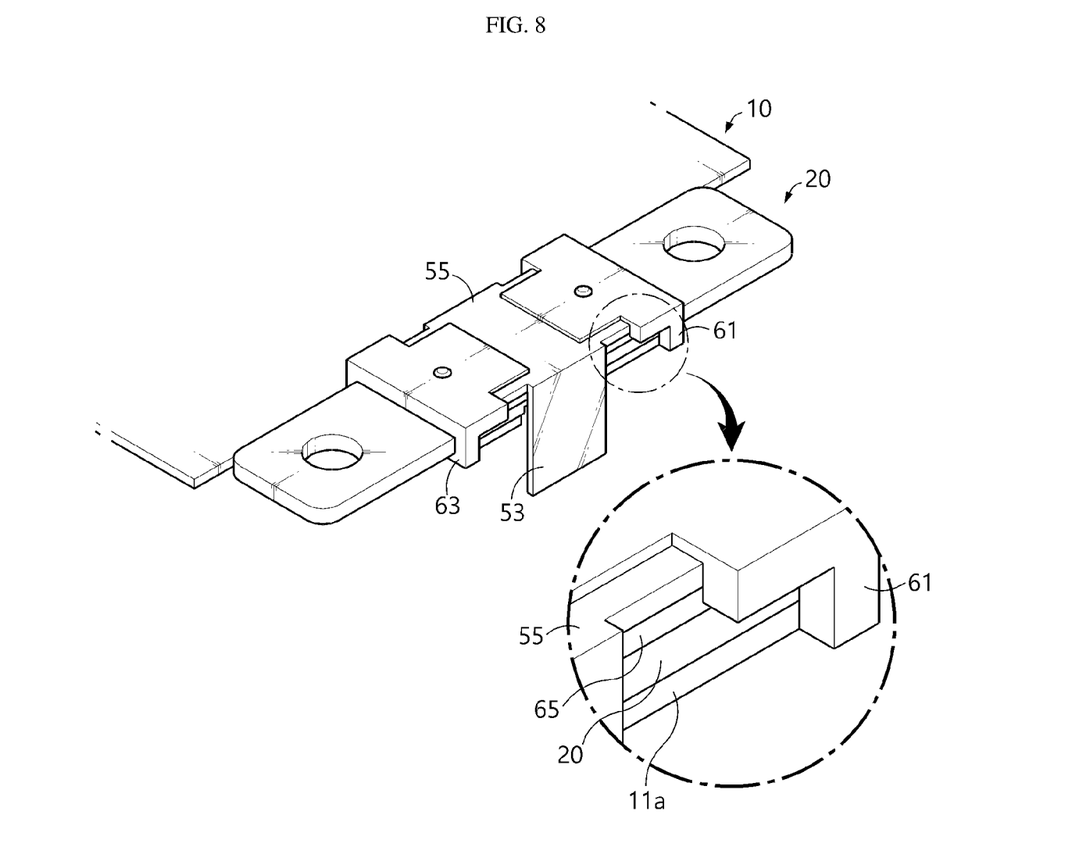
FIG. 8 is a bottom perspective view of the integrated current-measuring apparatus of FIG. 2.

Referring to FIGS. 2, 7, and 8, the integrated current-measuring apparatus 1 of the current embodiment may further include the shield member 50 to improve the performance of the Hall sensor 30.

The shield member 50 may form a wall structure surrounding the Hall sensor 30 and a part of the shunt resistor 20, i.e., a middle part of the shunt resistor 20 located under the Hall sensor 30. The shield member 50 may be made of metal, e.g., nickel (Ni) or an alloy of Ni, iron (Fe), and Cu. The shield member 50 serves to reduce errors of the Hall sensor 30 by concentrating the magnetic flux and protecting the Hall sensor 30 from external disturbance.

Specifically, the shield member 50 may include a pair of vertical panels 51 and 53 serving as the wall structure, and a horizontal panel 55 configured to connect the pair of vertical panels 51 and 53.

The horizontal panel 55 of the shield member 50 may have a horizontal (X-axis direction) width greater than a vertical (Y-axis direction) width and extend to exceed both sides of the vertical panels 51 and 53 so as to be parallel to the shunt resistor 20.

The horizontal panel 55 has parts 55a curved in an almost 'H' shape. The curved parts 55a are to avoid the contact with the joint members 41 and 42. That is, the horizontal panel 55 may have any shape other than the 'H' shape as long as the contact with the joint members 41 and 42 is avoidable.

The above-described shunt resistor 20 and shield member 50 may be produced as a single assembly by using an assembly guide unit 60, so as to be easily assembled with the PCB 10.

Figure 9:
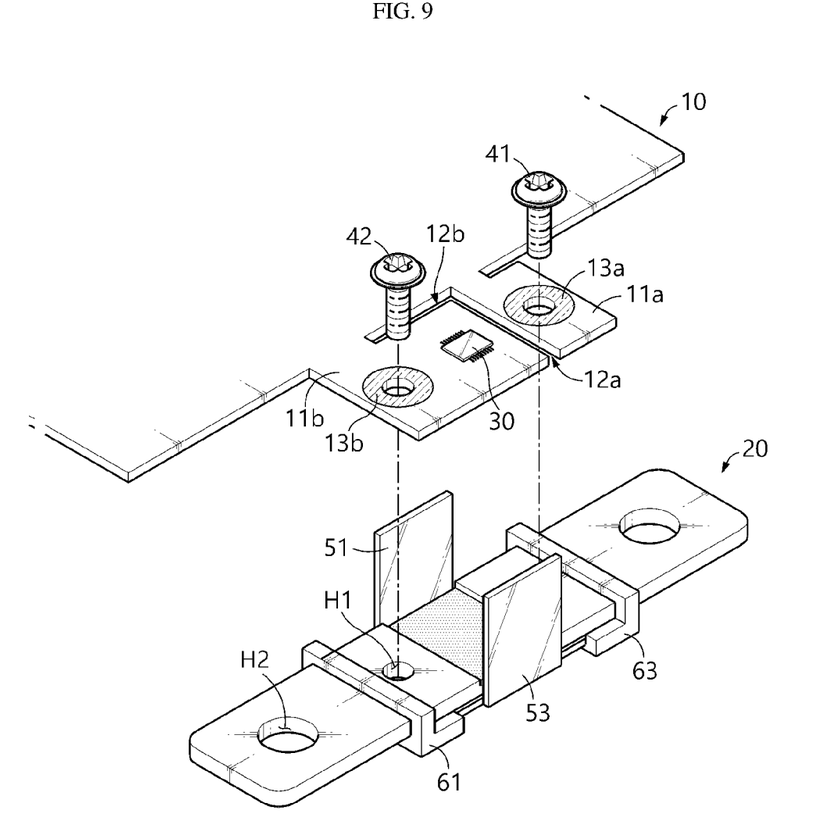
FIG. 9 is an exploded perspective view of the integrated current-measuring apparatus.

That is, as illustrated in FIGS. 8 and 9, the integrated current-measuring apparatus 1 according to an embodiment of the present disclosure may further include the assembly guide unit 60 configured to integrally mount the shunt resistor 20 and the shield member 50 on the PCB 10 as a single assembly.

The assembly guide unit 60 includes two supporting parts 61 and 63 and an insulating plate 65.

The two supporting parts 61 and 63 may be provided in a double structure to individually surround the shunt resistor 20 and the horizontal panel 55 of the shield member 50 at locations spaced apart from each other by a predetermined distance.

The distance between the two supporting parts 61 and 63 may correspond to the horizontal length of the sensor mounting part 11 of the PCB 10 such that the two supporting parts 61 and 63 may be aligned with the edge line of the sensor mounting part 11 when assembled with the PCB 10.

The insulating plate 65 may connect the two supporting parts 61 and 63 into a single body and be located between the shunt resistor 20 and the horizontal panel 55 of the shield member 50 to insulate the shunt resistor 20 from the shield member 50.

For example, the entirety or a part of the assembly of the shunt resistor 20, the shield member 50, and the assembly guide unit 60 may be integrally produced using insert molding.

A process of assembling the assembly of the shunt resistor 20, the shield member 50, and the assembly guide unit 60 with the PCB 10 will now be briefly described.

Initially, the assembly is put on the bottom surface of the sensor mounting part 11. In this case, assembly locations between the assembly and the sensor mounting part 11 may be naturally aligned by inserting one of the vertical panels 51 and 53 of the shield member 50 into the second gap 12b of the sensor mounting part 11. Specifically, an assembly structure in which a middle part of the shunt resistor 20 is placed directly under the Hall sensor 30 and the shield member 50 surrounds the Hall sensor 30 is required to serve as a current sensor, and the present disclosure may achieve the above-described assembly structure due to geometric features of the assembly and the sensor mounting part 11.

Then, the assembly is screwed to the sensor mounting part 11 by using the joint members 41 and 42. In this case, the joint members 41 and 42 may be two screws and the two screws may be respectively inserted into the first and second mounting portions 11a and 11b so as to be connected to the terminals 23 and 25 of the shunt resistor 20. As described above, the joint members 41 and 42 may be used to measure a voltage difference through the resistive element 21 of the shunt resistor 20. The Hall sensor 30 may measure a current flowing through the shunt resistor 20, based on the Hall effect.

Based on the above-described configuration and operation of the integrated current-measuring apparatus 1 according to the current embodiment, a current flowing between a battery pack and a load may be measured twice based on different principles of the shunt resistor 20 and the Hall sensor 30. That is, the current of the battery pack may be measured using two types of current sensors and thus malfunction including an error between the current sensors may be detected and diagnosed. Therefore, a battery pack including the integrated current-measuring apparatus 1 and an electric vehicle or electric devices for receiving power supplied from the battery pack may be improved in stability.

Figure 10:
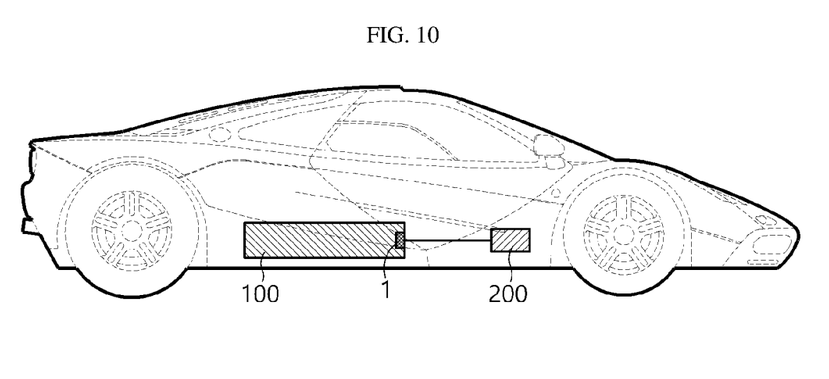
FIG. 10 is a schematic view illustrating an example in which a battery pack according to an embodiment of the present disclosure is applied to an electric vehicle.

Meanwhile, referring to FIG. 10, a battery pack 100 according to the present disclosure may include the above-described integrated current-measuring apparatus 1. A current of the battery pack 100 may flow to a load 200 via the integrated current-measuring apparatus 1.

In addition to the integrated current-measuring apparatus 1, the battery pack 100 according to the present disclosure may further include at least one battery module including a set of pouch-type or can-type secondary batteries, a pack case configured to accommodate the battery module, and various devices configured to control charge/discharge of the battery module, e.g., a BMS, a relay, and a fuse.

The battery pack 100 may be used as an energy source for supplying power to a motor of a hybrid electric vehicle (HEV) or an electric vehicle (EV). The battery pack 100 may also be used for an energy storage system (ESS).

While the present disclosure has been particularly shown and described with reference to embodiments thereof, it will be understood by one of ordinary skill in the art that various changes in form and details may be made therein without departing from the scope of the present disclosure as defined by the following claims.

It will be also understood by one of ordinary skill in the art that directional terms used herein, e.g., "top", "bottom", "left", "right", "front", and "rear", are merely for convenience of explanation and are switchable depending on the location of a target object or a viewer.

What is claimed is:

1. An integrated current-measuring apparatus, comprising:
    a printed circuit board having opposing first and second surfaces;
    a shunt resistor comprising a resistive element having a preset resistance and terminals extending from both sides of the resistive element, the shunt resistor being attached to the first surface of the printed circuit board; and
    a Hall sensor mounted on the second surface of the printed circuit board to face the shunt resistor with the printed circuit board being interposed between the Hall sensor and the shunt resistor,
    wherein the shunt resistor comprises a pair of first screw holes formed in the respective terminals of the shunt resistor with the resistive element being interposed between the pair of first screw holes, and
    wherein the printed circuit board includes a pair of apertures corresponding to the pair of first screw holes, and
    wherein the integrated current-measuring apparatus further comprises a pair of joint members integrally coupling a respective aperture to its corresponding first screw hole to fix the shunt resistor to the first surface of the printed circuit board, wherein the pair of joint members are configured to serve as voltage-measuring lead pins of the integrated current-measuring apparatus.

2. The integrated current-measuring apparatus of claim 1, wherein the printed circuit board comprises a sensor mounting part protruding from a side of the printed circuit board in a first direction, and having a length in a second direction perpendicular to the first direction that is less than a length of the shunt resistor in the second direction, and
    wherein the shunt resistor is attached to the first surface of the printed circuit board at the sensor mounting part.

3. The integrated current-measuring apparatus of claim 2, wherein the sensor mounting part comprises a first mounting portion and a second mounting portion spaced apart from each other by a predetermined gap.

4. The integrated current-measuring apparatus of claim 3, further comprising a shield member forming a wall structure surrounding the Hall sensor and a part of the shunt resistor.

5. The integrated current-measuring apparatus of claim 4, wherein the shield member comprises a pair of vertical panels spaced apart from each other in the first direction, and a horizontal panel configured to connect the pair of vertical panels, wherein the shunt resistor is positioned between the sensor mounting part of the printed circuit board and the horizontal panel.

6. The integrated current-measuring apparatus of claim 5, wherein the gap between the first and second mounting portions is "L" shaped and one of the pair of vertical panels perpendicularly passes through the gap.

7. The integrated current-measuring apparatus of claim 5, further comprising an assembly guide unit configured to maintain insulation between the shunt resistor and the shield member and to integrally mount the shunt resistor and the shield member on the sensor mounting part.

8. The integrated current-measuring apparatus of claim 7, wherein the assembly guide unit comprises first and second supporting parts configured to surround the shunt resistor and the horizontal panel of the shield member from first and second sides, respectively, wherein the first and second supporting parts are spaced apart from each other by a predetermined distance.

9. The integrated current-measuring apparatus of claim 8, wherein the assembly guide unit further comprises an insulating plate located between the shunt resistor and the horizontal panel of the shield member and configured to connect the two supporting parts into a single body.

10. A battery pack comprising the integrated current-measuring apparatus of claim 1.

11. An integrated current-measuring apparatus comprising:
- a printed circuit board having opposing first and second surfaces;
- a shunt resistor comprising a resistive element having a preset resistance and terminals extending from both sides of the resistive element, the shunt resistor being attached to the first surface of the printed circuit board; and
- a Hall sensor mounted on the second surface of the printed circuit board to face the shunt resistor with the printed circuit board being interposed between the Hall sensor and the shunt resistor, wherein the printed circuit board comprises a sensor mounting part protruding from a side of the printed circuit board in a first direction, and having a length in a second direction perpendicular to the first direction that is less than a length of the shunt resistor in the second direction, and wherein the shunt resistor is attached to the first surface of the printed circuit board at the sensor mounting part, and wherein the sensor mounting part comprises a first mounting portion and a second mounting portion spaced apart from each other by a predetermined gap.

12. The integrated current-measuring apparatus of claim 11, further comprising a shield member forming a wall structure surrounding the Hall sensor and a part of the shunt resistor.

13. The integrated current-measuring apparatus of claim 12, wherein the shield member comprises a pair of vertical panels spaced apart from each other in the first direction, and a horizontal panel configured to connect the pair of vertical panels, wherein the shunt resistor is positioned between the sensor mounting part of the printed circuit board and the horizontal panel.

14. The integrated current-measuring apparatus of claim 13, wherein the gap between the first and second mounting portions is "L" shaped and one of the pair of vertical panels perpendicularly passes through the gap.

15. The integrated current-measuring apparatus of claim 13, further comprising an assembly guide unit configured to maintain insulation between the shunt resistor and the shield member and to integrally mount the shunt resistor and the shield member on the sensor mounting part.

16. The integrated current-measuring apparatus of claim 15, wherein the assembly guide unit comprises first and second supporting parts configured to surround the shunt resistor and the horizontal panel of the shield member from first and second sides, respectively, wherein the first and second supporting parts are spaced apart from each other by a predetermined distance.

17. The integrated current-measuring apparatus of claim 16, wherein the assembly guide unit further comprises an insulating plate located between the shunt resistor and the horizontal panel of the shield member and configured to connect the two supporting parts into a single body.

18. A battery pack comprising the integrated current-measuring apparatus of claim 11.

* * * * *